(12) United States Patent
Fujiwara et al.

(10) Patent No.: US 7,820,007 B2
(45) Date of Patent: Oct. 26, 2010

(54) SILICON ELECTRODE PLATE FOR PLASMA ETCHING WITH SUPERIOR DURABILITY

(75) Inventors: Hideki Fujiwara, Tokyo (JP); Kazuhiro Ikezawa, Tokyo (JP); Hiroaki Taguchi, Tokyo (JP); Naofumi Iwamoto, Takarazuka (JP); Toshinori Ishii, Osaka (JP); Takashi Komekyu, Sanda (JP)

(73) Assignees: Sumco Corporation, Tokyo (JP); Mitsubishi Materials Corporation, Tokyo (JP)

( * ) Notice: Subject to any disclaimer, the term of this patent is extended or adjusted under 35 U.S.C. 154(b) by 725 days.

(21) Appl. No.: 10/599,440

(22) PCT Filed: Mar. 30, 2005

(86) PCT No.: PCT/JP2005/006134

§ 371 (c)(1),
(2), (4) Date: Sep. 28, 2006

(87) PCT Pub. No.: WO2005/096361

PCT Pub. Date: Oct. 13, 2005

(65) Prior Publication Data

US 2007/0181868 A1    Aug. 9, 2007

(30) Foreign Application Priority Data

Apr. 1, 2004  (JP) .............................. 2004-108731
Aug. 12, 2004 (JP) .............................. 2004-234961

(51) Int. Cl.
*H01L 21/00* (2006.01)

(52) U.S. Cl. .............................. 156/345.43; 156/345.47

(58) Field of Classification Search ............... 118/723 E, 118/723 R; 156/345.43, 345.44, 345.45, 156/345.46, 345.47
See application file for complete search history.

(56) References Cited

U.S. PATENT DOCUMENTS

| | | | | |
|---|---|---|---|---|
| 3,852,175 A | * | 12/1974 | Hoekje | 205/532 |
| 4,554,141 A | * | 11/1985 | Scull et al. | 95/144 |
| 5,685,949 A | * | 11/1997 | Yashima | 438/694 |
| 5,951,814 A | * | 9/1999 | Saito et al. | 156/345.1 |
| 5,993,597 A | * | 11/1999 | Saito et al. | 156/345.47 |
| 2002/0127853 A1 | * | 9/2002 | Hubacek et al. | 438/689 |

FOREIGN PATENT DOCUMENTS

| | | |
|---|---|---|
| JP | 8-37179 A | 2/1996 |
| JP | 10-17393 A | 1/1998 |
| JP | 10-29894 A | 2/1998 |
| JP | 2002-134518 A | 5/2002 |
| JP | 2002-299345 A | 10/2002 |
| JP | 2003-137687 A | 5/2003 |

OTHER PUBLICATIONS

International Search Report for PCT/JP2005/006134 completed May 19, 2005.
Japanese Office Action mailed Jul. 30, 2009 for the corresponding Japanese Patent Application No. 2004-234961.

* cited by examiner

*Primary Examiner*—Parviz Hassanzadeh
*Assistant Examiner*—Michelle Crowell
(74) *Attorney, Agent, or Firm*—Leason Ellis LLP

(57) ABSTRACT

This silicon electrode plate for plasma etching is a silicon electrode plate for plasma etching with superior durability including silicon single crystal which, in terms of atomic ratio, contains 3 to 11 ppba of boron, and further contains a total of 0.5 to 6 ppba of either or both of phosphorus and arsenic.

2 Claims, 1 Drawing Sheet

SILICON ELECTRODE PLATE FOR PLASMA ETCHING WITH SUPERIOR DURABILITY

CROSS-REFERENCE TO PRIOR APPLICATION

This is a U.S. National Phase Application under 35 U.S.C. §371 of International Patent Application No. PCT/JP2005/006134 filed Mar. 30, 2005, and claims the benefit of Japanese Patent Applications No. 2004-108731, filed Apr. 1, 2004 and 2004-234961, filed Aug. 12, 2004, all of which are incorporated by reference herein. The International Application was published in Japanese on Oct. 13, 2005 as WO 2005/096361 A1 under PCT Article 21(2).

TECHNICAL FIELD

This invention relates to a silicon electrode plate for plasma etching with superior durability.

BACKGROUND ART

Generally, when manufacturing semiconductor integrated circuits, it is necessary to conduct etching on an interlayer insulating film formed on a silicon wafer. A plasma etching device is used in order to conduct etching on this silicon wafer having the interlayer insulating film (hereinafter referred to as a wafer), and silicon is used as the electrode material inside this device. As shown in the schematic explanatory view of a partial cross-section in FIG. 1, the silicon electrode plate for plasma etching has a structure provided with etching gas ejecting through-holes 5 arranged in parallel in the thickness direction of the silicon single crystal plate. This silicon electrode plate for plasma etching 1 is fixed approximately at the center inside a vacuum container (not illustrated). A wafer 4 is placed on a stand 6, and high frequency voltage is impressed while etching gas 7 flows toward the wafer 4 through the etching gas ejecting through-holes 5. Thereby, plasma 2 is generated between the silicon electrode plate for plasma etching 1 and the wafer 4, and this plasma is made to act upon the wafer 4 to etch the surface of the wafer 4.

When plasma etching is conducted using a silicon electrode plate for plasma etching 1, electrical charge concentration areas (edge portion on which electrical charge is concentrated) are generated locally at the terminal openings of the etching gas ejecting through-holes 5 that contact the plasma 2, and these portions are more subject to wear. With respect to the etching gas ejecting through-holes 5 which are provided parallel to the thickness direction of the silicon electrode plate for plasma etching 1, as shown in FIG. 2, the opening of the etching gas ejecting through-holes 5 that contacts the plasma 2 becomes enlarged as it wears away so that it widens toward the bottom. Thereby, abrasion holes 3 are formed.

In the conventional silicon electrode plates for plasma etching 1 which are composed of silicon single crystal plates, the abrasion holes 3 are easy to be generated, and the length α in which the etching gas ejecting through-holes 5 has uniform diameter is reduced due to the formation of the abrasion holes 3 by plasma etching operations. Thereby, the wafer etching tends to become irregular.

In order to solve the above problem, a silicon electrode plate for plasma etching has been offered that is made of silicon containing 0.01 ppm to 5 mass % of a dopant of any one element selected from among P, As, Sb and B. This silicon electrode plate for plasma etching composed of the doped silicon single crystal plate has superior electrical conductivity; thereby, the formation of abrasion holes 3 due to generation of localized electrical charge concentration areas is suppressed. Accordingly, it is said that abrasion of the etching gas ejecting through-holes 5 is reduced, the flow of etching gas becomes uniform, and the lifetime is extended (see Patent Document 1 or 2).

However, it is impossible to avoid generation of the above-described abrasion holes 3 due to the plasma etching over a long period of time. Moreover, since in-plane irregularities occur with respect to the generated amount of the abrasion holes 3 formed in the silicon electrode plate for plasma etching 1, with the growing demands in recent years to keep the density of the plasma 2 uniform and maintain a more uniform etching of the wafer 4, the time of use of one silicon electrode plate for plasma etching 1 must be kept short, and early replacement must be conducted. The replaced silicon electrode plates for plasma etching 1 are then scrapped, resulting in a wasteful mode of use.

(Patent Document 1) Japanese Patent Application, First Publication No. H8-37179

(Patent Document 2) Japanese Patent Application, First Publication No. H10-17393

DISCLOSURE OF THE INVENTION

Problems to be Solved by the Invention

The present invention has been made in light of the foregoing circumstances, and its object is to offer a silicon electrode plate for plasma etching which has more superior durability with little wear (i.e., generation of abrasion holes) of the etching gas ejecting through-holes and with a small in-plane distribution of abrasion holes, even when plasma etching is conducted over a long period of time.

Means for Solving the Problems

As a result of research from the pertinent standpoint aimed at obtaining a silicon electrode plate for plasma etching having a more excellent durability with a small in-plane distribution of abrasion holes, the present inventors and others obtained the following research results.

(A) Compared to a silicon single crystal plate solely containing boron or phosphorus, a silicon electrode plate for plasma etching including a silicon single crystal plate which contains, in coexistence with boron, either or both of phosphorus and arsenic further reduces abrasion of etching gas ejecting through-holes, and decreases in-plane abrasion irregularities.

(B) It is preferable that the content thereof in terms of atomic ratio be within the range of boron: 3 to 11 ppba (parts per billion atoms), and either or both of phosphorus and arsenic: 0.5 to 6 ppba.

The present invention was made based on the above research results.

The silicon electrode plate for plasma etching of the present invention has superior durability and includes silicon single crystal that contains, in terms of atomic ratio, 3 to 11 ppba of boron, and further contains a total of 0.5 to 6 ppba of either or both of phosphorus and arsenic.

In terms of atomic ratio, in the case in which boron is less than 3 ppba or the total of either or both of phosphorus and arsenic is less than 0.5 ppba, the desired effect relating to the amount of abrasion is not obtained; on the other hand, in the case in which boron content exceeds 11 ppba or where the total content of either or both of phosphorus and arsenic exceeds 6 ppba, the in-plane distribution of the etching plate becomes irregular, leading to undesirable results. Consequently, the boron content and the total content of either or both of phosphorus and arsenic in the silicon electrode plate for plasma etching have been set to 3 to 11 ppba of boron, and a total of 0.5 to 6 ppba of either or both of phosphorus and arsenic.

Effects of the Invention

When this silicon electrode plate for plasma etching is used, the amount of abrasion of the through-pore-holes becomes uniform, and it is possible to conduct uniform plasma etching over a longer period than that in the conventional case. Consequently, the frequency of replacement of the silicon electrode plates for plasma etching due to plasma etching can be greatly reduced, and a major contribution can be made to the development of the semiconductor device industry.

Figure 1:
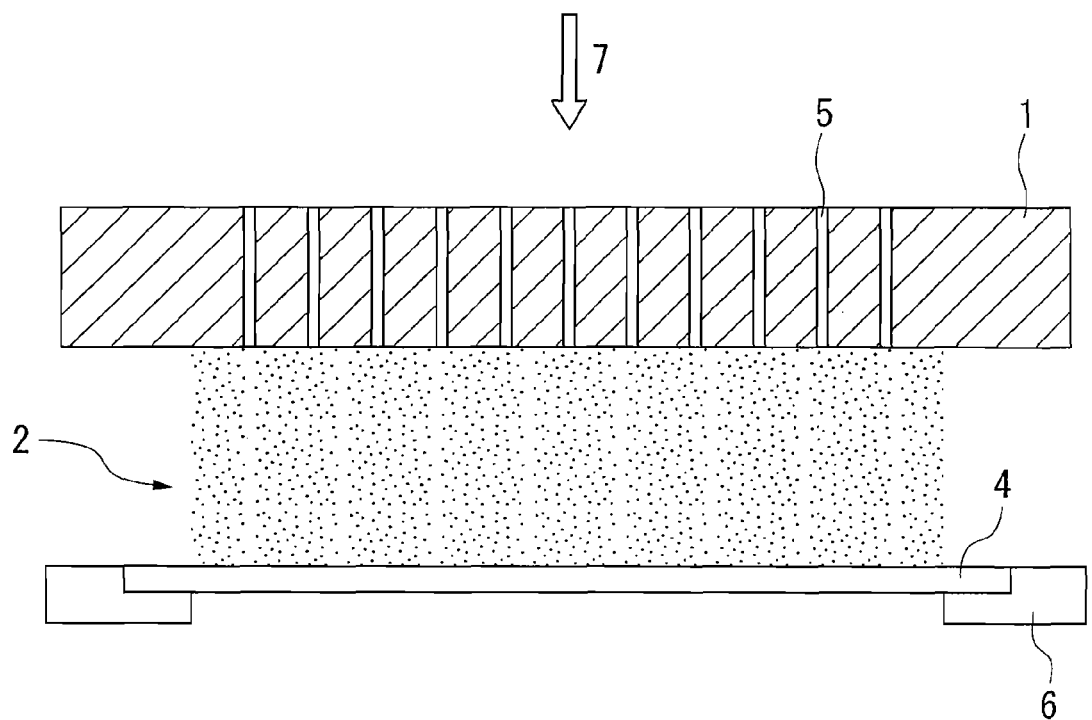
FIG. 1 is a schematic explanatory view of partial cross-section that serves to explain the conditions of use of a silicon electrode plate for plasma etching.

BRIEF DESCRIPTION OF THE SYMBOLS 1 silicon electrode plate for plasma etching
2 plasma
3 abrasion hole
4 wafer
5 etching gas ejecting through-holes
6 stand
7 etching gas

BEST MODE FOR CARRYING OUT THE INVENTION

Preferred embodiments of the present invention are described below.

Embodiment 1

Si raw material with a purity of 11 N was melted, and initially doped with B and P so as to prepare a Si melt containing 1 to 15 ppba of B and 1 to 10 ppba of P. Using this Si melt, a silicon single crystal having a diameter of 300 mm was prepared by the CZ method. After circular cutting and slicing this ingot at a thickness of 8 mm by a diamond band saw, a silicon single crystal electrode substrate with a diameter of 290 mm and a thickness of 6 mm was prepared by grinding.

Etching gas ejecting through-holes with a diameter of 0.3 mm were formed at 5 mm intervals in this silicon single crystal electrode substrate, and then this silicon single crystal electrode substrate was immersed in a liquid mixture of hydrofluoric acid, acetic acid and nitric acid for 5 minutes so as to remove the surface machining layer; whereby were prepared silicon electrode plates for plasma etching of the present invention (hereinafter, electrode plates of the present invention) 1 to 14 containing B and P in the contents shown in Table 1, comparative silicon electrode plates for plasma etching (hereinafter, comparative electrode plates) 1 and 2, and conventional silicon electrode plates for plasma etching (hereinafter, conventional electrode plates) 1 and 2.

The B and P contents of these electrode plates were measured by the photoluminescence method, that is, a method in which an Ar laser is irradiated to a cooled sample, and a diffraction grating spectrometer is used to detect the excited photoluminescence.

Furthermore, wafers with a $SiO_2$ layer formed in the surface were prepared in advance by the CVD method.

TABLE 1

| Classification | | Dopant concentration (ppba) | | Number of wafers subjected to etching until end of life of the electrode plate (wafers) |
|---|---|---|---|---|
| | | B | P | |
| Electrode plates of the present invention | 1 | 3.0 | 1.0 | 21110 |
| | 2 | 3.7 | 0.8 | 21080 |
| | 3 | 3.7 | 5.2 | 20756 |
| | 4 | 4.0 | 2.0 | 22153 |
| | 5 | 4.6 | 1.0 | 22197 |
| | 6 | 5.0 | 0.9 | 23412 |
| | 7 | 5.0 | 2.0 | 23213 |
| | 8 | 6.1 | 1.3 | 21157 |
| | 9 | 6.0 | 2.0 | 21995 |
| | 10 | 6.4 | 3.5 | 21033 |
| | 11 | 7.0 | 3.0 | 20816 |
| | 12 | 8.0 | 4.4 | 23702 |
| | 13 | 8.7 | 3.9 | 22983 |
| | 14 | 10.7 | 5.8 | 21033 |
| Comparative electrode plates | 1 | 2 | 0.3 | 18820 |
| | 2 | 12.0 | 6.5 | 17455 |
| Conventional electrode plates | 1 | 5 | — | 19020 |
| | 2 | — | 5 | 17211 |

These electrode plates of the present invention 1 to 14, comparative electrode plates 1 and 2, and conventional electrode plates 1 and 2 were respectively set in plasma etching devices, and wafers in which a $SiO_2$ layer was formed were also set in the plasma etching devices.

Figure 2:
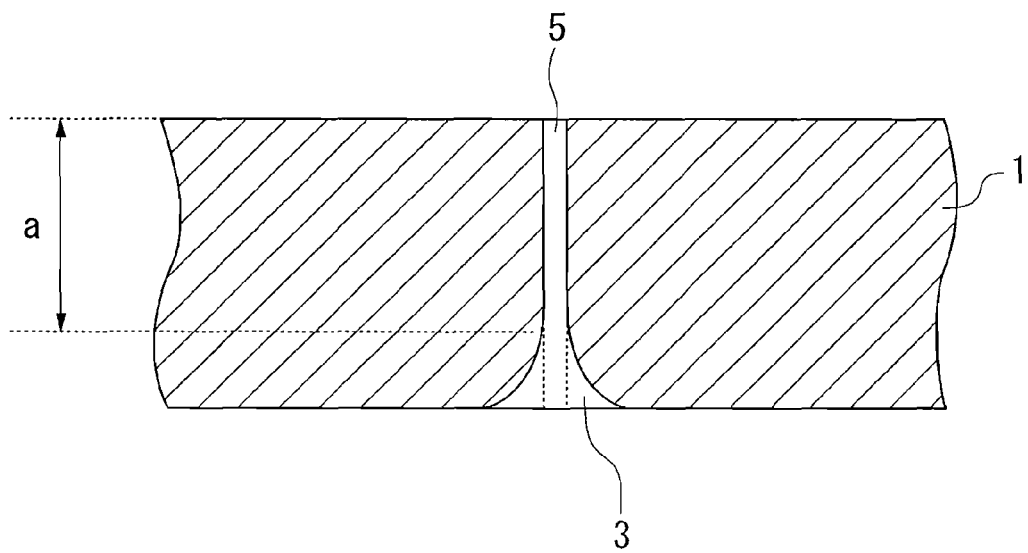
FIG. 2 is a sectional explanatory view that serves to explain abrasion conditions in the etching gas ejecting through-holes of a silicon electrode plate for plasma etching.

The $SiO_2$ layers in the wafer surface were subjected to plasma etching under the following conditions, and usage life was set at the point where the length of the etching gas ejecting through-holes (the length of the part shown by α in FIG. 2) provided in the electrode plates of the present invention 1 to 14, the comparative electrode plates 1 and 2, and the conventional electrode plates 1 and 2 became 1 mm, and the number of wafers which had been subjected to etching treatment until the end of usage life was obtained The obtained results are shown in Table 1.

Internal pressure of chamber: $10^{-1}$ Torr

Etching gas composition: 90 sccm of $CHF_3$+4 sccm of $O_2$+150 sccm of He

High frequency power: 2 kW

Frequency: 20 kHz

From the results shown in Table 1, it is clear that the electrode plates of the present invention 1 to 14 containing both B and P have a longer usage life than the conventional electrode plates 1 and 2 containing only B or P. Since the comparative electrode plates 1 and 2 containing B and P in amounts deviating from the scope of this invention have a short usage life, they are undesirable.

Embodiment 2

Si raw material with a purity of 11 N was melted, and initially doped with B and As so as to prepare a Si melt containing 1 to 15 ppba of B and 1 to 10 ppba of As. Using this Si melt, silicon single crystal silicon having a diameter of 300 mm was prepared by the CZ method. After circular cutting and slicing this ingot at a thickness of 8 mm by a diamond band saw, a silicon single crystal electrode substrates with a diameter of 290 mm and a thickness of 6 mm was prepared by grinding.

Etching gas ejecting through-holes with a diameter of 0.3 mm were formed at 5 mm intervals in this silicon single crystal electrode substrate, and then this silicon single crystal electrode substrate was immersed in a liquid mixture of hydrofluoric acid, acetic acid and nitric acid for 5 minutes so as to remove the surface machining layer; whereby 5 were prepared electrode plates of the present invention 15 to 28, comparative silicon electrode plates 3 and 4, and conventional electrode plate 3.

The B and As contents of these electrode plates were measured by the photoluminescence method.

Furthermore, wafers with a $SiO_2$ layer formed in the surface were prepared in advance by the CVD method.

These electrode plates of the present invention 15 to 28, comparative electrode plates 3 and 4, and conventional electrode plate 3 were respectively set in plasma etching devices, and wafers on which a $SiO_2$ layer was formed were also set in the plasma etching devices.

As in Embodiment 1, the $SiO_2$ layer in the wafer surface was subjected to plasma etching under the following conditions, and usage life was set at the point where the length of the etching gas ejecting through-holes (the length of the part shown by α in FIG. 2) provided in the electrode plates of the present invention 15 to 28, comparative electrode plates 3 and 4, and conventional electrode plate 3 became 1 mm, and the number of wafers which had been subjected to etching treatment until the end of usage life was obtained. The obtained results are shown in Table 2.

Internal pressure of chamber: $10^{-1}$ Torr

Etching gas composition: 90 sccm of $CHF_3$+4 sccm of $O_2$+150 sccm of He

High frequency power: 2 kW

Frequency: 20 kHz

TABLE 2

| Classification | | Dopant concentration (ppba) | | Number of wafers subjected to etching until end of life of the electrode plate (wafers) |
|---|---|---|---|---|
| | | B | As | |
| Electrode plates of the present invention | 15 | 3.0 | 0.9 | 20055 |
| | 16 | 3.6 | 0.8 | 20987 |
| | 17 | 3.7 | 5.1 | 20884 |
| | 18 | 4.0 | 2.0 | 21435 |
| | 19 | 4.5 | 1.0 | 21978 |
| | 20 | 5.1 | 0.9 | 22859 |
| | 21 | 5.0 | 1.9 | 23181 |
| | 22 | 6.0 | 1.2 | 20897 |
| | 23 | 6.1 | 2.1 | 21098 |
| | 24 | 6.4 | 3.5 | 21298 |
| | 25 | 7.0 | 3.1 | 20534 |
| | 26 | 8.1 | 4.5 | 23475 |
| | 27 | 8.7 | 4.0 | 22845 |
| | 28 | 10.7 | 5.9 | 21857 |
| Comparative electrode plates | 3 | 2 | 0.4 | 18155 |
| | 4 | 11.7 | 6.3 | 17211 |
| Conventional electrode plates | 3 | — | 5 | 17324 |

From the results shown in Table 2, it is clear that the electrode plates of the present invention 15 to 28 containing both B and As have a longer usage life than the conventional electrode plate 1 of Table 1 containing only B and the conventional electrode plate 3 of Table 2 containing only As. Since the comparative electrode plates 3 and 4 containing B and As in amounts deviating from the scope of this invention have a short usage life, they are undesirable.

Embodiment 3

Si raw material with a purity of 11 N was melted, and initially doped with B, P and As so as to prepare a Si melt containing 1 to 15 ppba of B and 1 to 10 ppba of P+As. Using this Si melt, silicon single crystal having a diameter of 300 mm was prepared by the CZ method. After circular cutting and slicing this ingot at a thickness of 8 mm by a diamond band saw, a silicon single crystal electrode substrates with a diameter of 290 mm and a thickness of 6 mm was prepared by grinding.

Etching gas ejecting through-holes with a diameter of 0.3 mm were formed at 5 mm intervals in this silicon single crystal electrode substrate, and then this silicon single crystal electrode substrate was immersed in a liquid mixture of hydrofluoric acid, acetic acid and nitric acid for 5 minutes so as to remove the surface machining layer; whereby were prepared electrode plates of the present invention 29 to 33, and comparative silicon electrode plates 5 and 6.

The B, P and As contents of these electrode plates were measured by the photoluminescence method.

Furthermore, wafers with a $SiO_2$ layer formed in the surface were prepared in advance by the CVD method.

These electrode plates of the present invention 29 to 33 and comparative electrode plates 5 and 6 were respectively set in plasma etching devices, and wafers on which a $SiO_2$ layer was formed were also set in the plasma etching devices.

As in Embodiment 1, the $SiO_2$ layers in the wafer surface were subjected to plasma etching under the following conditions, and usage life was set at the point where the length of the etching gas ejecting through-holes (the length of the part shown by α in FIG. 2) provide in the electrode plates of the present invention 29 to 33 and comparative electrode plates 5 and 6 became 1 mm, and the number of wafers which had been subject to etching treatment until the end of usage life was obtained. The obtained results are shown in Table 3.

Internal pressure of chamber: $10^{-1}$ Torr

Etching gas composition: 90 sccm of $CHF_3$+4 sccm of $O_2$+150 sccm of He

High power: 2 kW

Frequency: 20 Hz

TABLE 3

| Classification | | Dopant concentration (ppba) | | | | Number of wafers subjected to etching until end of life of the electrode plate (wafers) |
|---|---|---|---|---|---|---|
| | | B | P | As | P + As | |
| Electrode plates of the present invention | 29 | 4.0 | 1.7 | 0.3 | 2.0 | 20084 |
| | 30 | 4.6 | 0.9 | 0.1 | 1.0 | 22114 |
| | 31 | 6.3 | 3.1 | 0.3 | 3.4 | 20987 |
| | 32 | 7.0 | 2.7 | 0.4 | 3.1 | 20012 |
| | 33 | 8.0 | 3.9 | 0.6 | 4.5 | 22876 |
| Comparative electrode plates | 5 | 2 | 0.2 | 0.1 | 0.3 | 17233 |
| | 6 | 12.0 | 6.5 | 0.7 | 7.2 | 16211 |

From the results shown in Table 3, it is clear that the electrode plates of the present invention 29 to 33 containing all of B, P and As have a longer usage life than the conventional electrode plate 1 of Table 1 containing only B, the conventional electrode plate 2 of Table 1 containing only P, and the conventional electrode plate 3 of Table 2 containing only As. Since the comparative electrode plates 5 and 6 containing B in amounts and P and As in total amounts which deviate from the scope of this invention have a short usage life, they are undesirable.

INDUSTRIAL APPLICABILITY

The silicon electrode plate for plasma etching of the present invention enables plasma etching that is more uniform over a longer period of time than the prior arts. Consequently, it is possible to greatly reduce the frequency of replacement of the silicon electrode plates for plasma etching due to plasma etching, and to greatly contribute to the developments of semiconductor devices.

The invention claimed is:

1. A silicon electrode plate for plasma etching with superior durability, the silicon electrode plate comprising silicon single crystal which, in terms of atomic ratio, contains 3 to 11 ppba of boron, and further contains a total of 0.5 to 6 ppba of either or both of phosphorus and arsenic.

2. A silicon electrode plate according to claim 1, wherein said silicon single crystal comprises Si raw material with a purity of 11N, and boron, and either or both of phosphorus and arsenic.

* * * * *